(12) United States Patent
Bhardwaj

(10) Patent No.: US 7,125,468 B2
(45) Date of Patent: Oct. 24, 2006

(54) METHOD OF MAKING ULTRASOUND TRANSDUCER OR ACTUATOR

(75) Inventor: Mahesh C. Bhardwaj, State College, PA (US)

(73) Assignee: The Ultran Group, State College, PA (US)

( * ) Notice: Subject to any disclaimer, the term of this patent is extended or adjusted under 35 U.S.C. 154(b) by 121 days.

(21) Appl. No.: 10/840,207

(22) Filed: May 6, 2004

(65) Prior Publication Data
US 2005/0000629 A1    Jan. 6, 2005

Related U.S. Application Data

(60) Provisional application No. 60/468,815, filed on May 8, 2003.

(51) Int. Cl.
*B32B 37/00* (2006.01)
*H01L 41/083* (2006.01)

(52) U.S. Cl. .................. 156/265; 156/290; 156/307.1; 156/307.7; 156/308.2; 29/25.35; 310/325; 310/334; 73/632

(58) Field of Classification Search ................ 156/254, 156/265, 290, 307.1, 307.7, 308.2, 512, 518, 156/560; 29/25.35; 310/325, 334; 73/632
See application file for complete search history.

(56) References Cited

U.S. PATENT DOCUMENTS

2002/0130590 A1*  9/2002  Shiraishi et al. ............ 310/334

* cited by examiner

*Primary Examiner*—Linda Gray
(74) *Attorney, Agent, or Firm*—The Webb Law Firm

(57) ABSTRACT

Method of making a gas matrix composite ultrasound transducer comprises aligning piezoelectric rods or fibers substantially parallel to each other on an adhesive side of a plurality of curable adhesive-faced sheets, stacking the sheets so as to maintain the gaps between the rods or fibers, curing the adhesive, cutting the cured structure perpendicular to the rods or fibers into narrow slices, and applying a conductive layer to each cut face to form electrical contacts with both ends of the rods or fibers.

5 Claims, 2 Drawing Sheets

METHOD OF MAKING ULTRASOUND TRANSDUCER OR ACTUATOR

CROSS REFERENCE TO RELATED APPLICATIONS

This application claims priority to U.S. Provisional Application Ser. No. 60/468,815, filed May 8, 2003.

BACKGROUND OF THE INVENTION

In my patent application Ser. No. 10/337,531, filed Jan. 7, 2003 and entitled "Piezoelectric Transducer with Gas Matrix", I disclose a novel transducer which comprises a plurality of piezoelectric cylinders. The axial length and composition of the piezoelectric cylinders determine the frequency of the transducers when excited. The axial ends of the piezoelectric cylinders are aligned with the faces. The piezoelectric cylinders are separated from each other in a manner to substantially reduce or substantially eliminate crosstalk. The piezoelectric cylinders or fibers may be separated from each other by a space that is empty or a space that is partially empty of matrix material resulting in a gap between the cylinders and the material so that the cylinders and material are substantially entirely unconnected. The piezoelectric cylinders are separated from each other by a distance that is preferably less than the acoustic wavelength at the frequency of the piezoelectric cylinders (rods) or fibers in the space between the cylinders. Electrodes are provided at the faces of the transducer for simultaneously exciting the piezoelectric cylinders.

The piezoelectric cylinders may have one or more of the following cross sections: circular, rectangular, hexagonal, or any other polygon, with a width preferably less than one wavelength of the frequency in the piezoelectric material. The matrix material may comprise a solidified foam, fiber batting, or honeycomb, for example, which material is not electrically conductive. The gap in the space between the piezoelectric cylinders may be filled with a gas at atmospheric pressure, gas below atmospheric pressure, or a vacuum.

It is an object, according to the present invention, to provide a novel method for the manufacture of gas matrix piezoelectric transducers and actuators.

SUMMARY OF THE INVENTION

Briefly, according to this invention, there is provided a method of making a gas matrix composite ultrasound transducer comprising the steps of forming a first structure by aligning piezoelectric rods or fibers substantially parallel to each other on an adhesive side of a first curable adhesive-faced sheet, placing a second sheet with adhesive on both sides over the first structure so as to provide a gap between the rods or fibers, aligning piezoelectric rods or fibers on a second sheet substantially parallel to the rod or fibers of the first structure, repeating these steps a plurality of times to build a second sandwich structure so as to maintain the gaps between the rods or fibers, curing the adhesive in the second structure, cutting the cured second structure perpendicular to the rods or fibers into narrow slices to form third structures, and applying an electrically conductive layer to each face of a third structure to form electrical contacts with both ends of the rods or fibers.

According to an alternate method, a gas matrix piezoelectric actuator is fabricated comprising the steps of forming a first structure by aligning piezoelectric rods or fibers substantially parallel to each other on an adhesive side of a first curable adhesive-faced sheet, placing a second sheet with adhesive on both sides over the first structure so as to provide a gap between the rods or fibers, placing a third sheet with an alternating electrode pattern printed thereon over the second sheet so as to maintain the gaps, placing a fourth sheet with adhesive on both sides over the third sheet, and repeating these steps a plurality of times to form a third structure so as to maintain the air gaps and applying a DC electric field so that the rods or fibers are polarized.

According to preferred embodiments, the first and second sheets have a substrate of compressed fibers, paper, cardboard, NOMEX paper, or the like.

BRIEF DESCRIPTION OF THE DRAWINGS

Further features and other objects and advantages will become clear from the following detailed description made with reference to the drawings in which.

DESCRIPTION OF THE PREFERRED EMBODIMENTS

Figure 1:
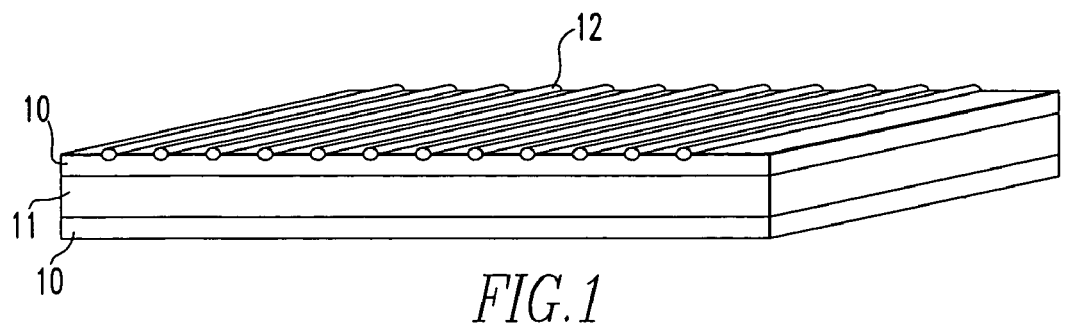
FIG. 1 illustrates a compressed fiber sheet with adhesive tape or glue on each side and piezoelectric fibers or rods on the face of the sheet.

Referring now to FIG. 1, the gas matrix transducer is assembled from a plurality of sheets that have double-bonded adhesive tape or glue fastening the tape 10 to each side of a substrate 11 comprised of compressed fibers, for example, paper or NOMEX paper. The sheets must be nonconductive and nonmagnetic. The major constituent of each substrate is void space.

Piezoelectric rods or fibers 12 that are polarized or unpolarized are arranged substantially parallel on an adhesive surface of the sheet. In such devices, the piezoelectric materials used are: lead zirconate-lead titanate solid solutions, lead meta niobates, lead titanates, lead magnesium niobate, lithium niobate, zinc oxide, quartz, barium titanate, polymer-based homogeneous materials, polymer matrix solid piezoelectric materials, etc.

Figure 2:
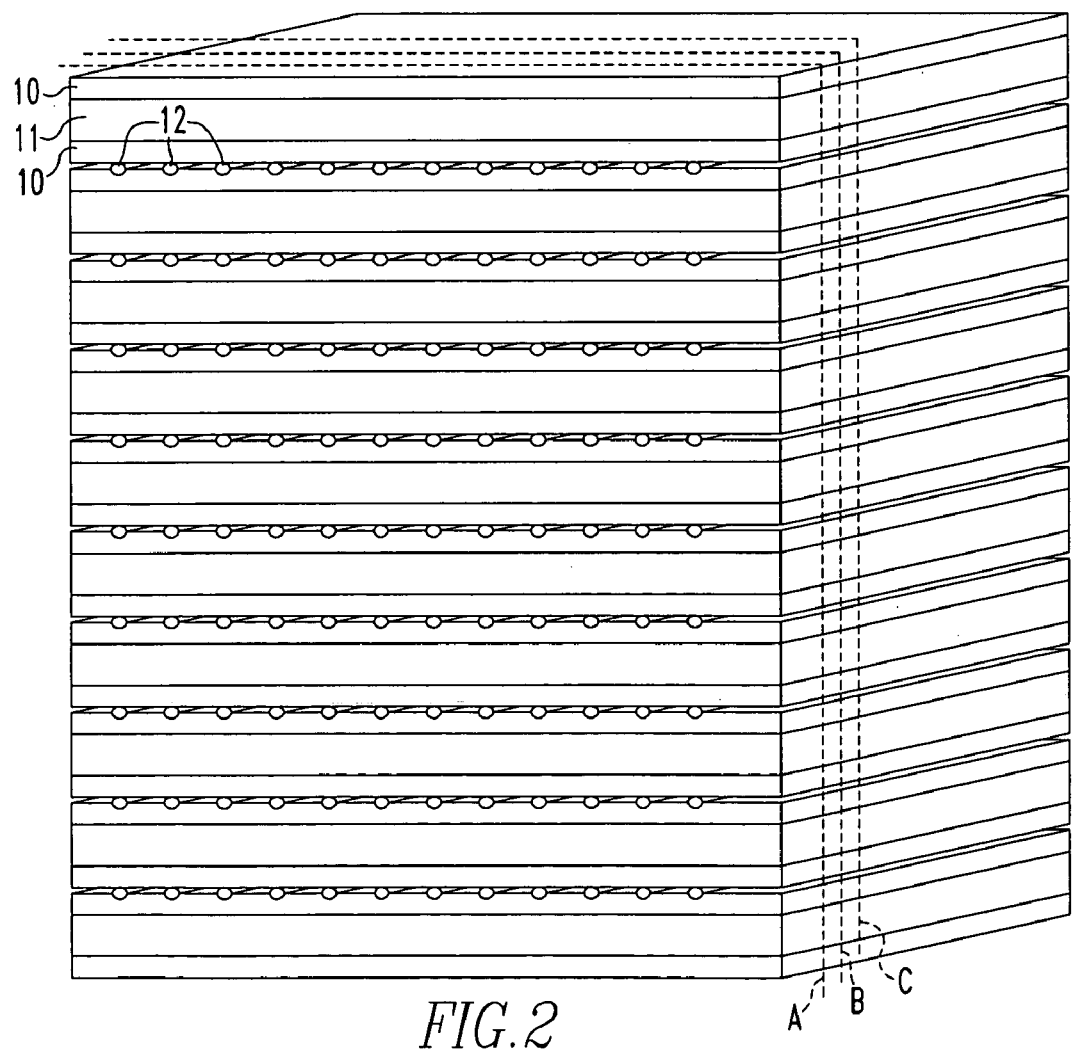
FIG. 2 illustrates an assembly of sheets as shown in FIG. 1.

As shown in FIG. 2, a number of layers as described with reference to FIG. 2 are assembled on top of each other to create a sandwich structure containing piezoelectric rods or fibers 12 separated by the compressed fiber sheets. After curing, the sandwich structure is cut across the rods or fibers 12 to a thickness corresponding to the desired frequency of the transducer along dash cut lines A, B, and C on FIG. 2. Electrodes are formed over each end surface placing the ends of the rods in electrical contact. The electrodes may be formed by sputtering gold, silver, or spraying a conductive epoxy over the ends of the rods 12.

Figure 3:
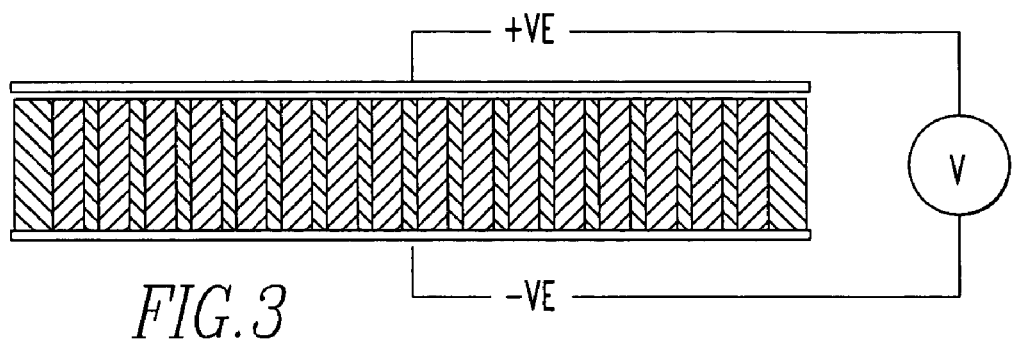
FIG. 3 illustrates the electrical connections to a piezoelectric transducer made according to this invention.

As shown in FIG. 3, the two faces of the piezoelectric composite are connected to a high voltage DC source to polarize the rods or fibers.

The substrates are preferably made of a NOMEX paper which is a high temperature resistant material invented by DuPont.

The piezoelectric fibers/rods 12 may be aligned and bonded on a thin self-adhesive double-faced nonelectrically conductive tape 10 or with an epoxy adhesive. Care should be taken to assure the fibers/rods 12 are not surrounded by adhesive but are physically separated by void space except where in-line contact with the adhesive.

Figure 4:
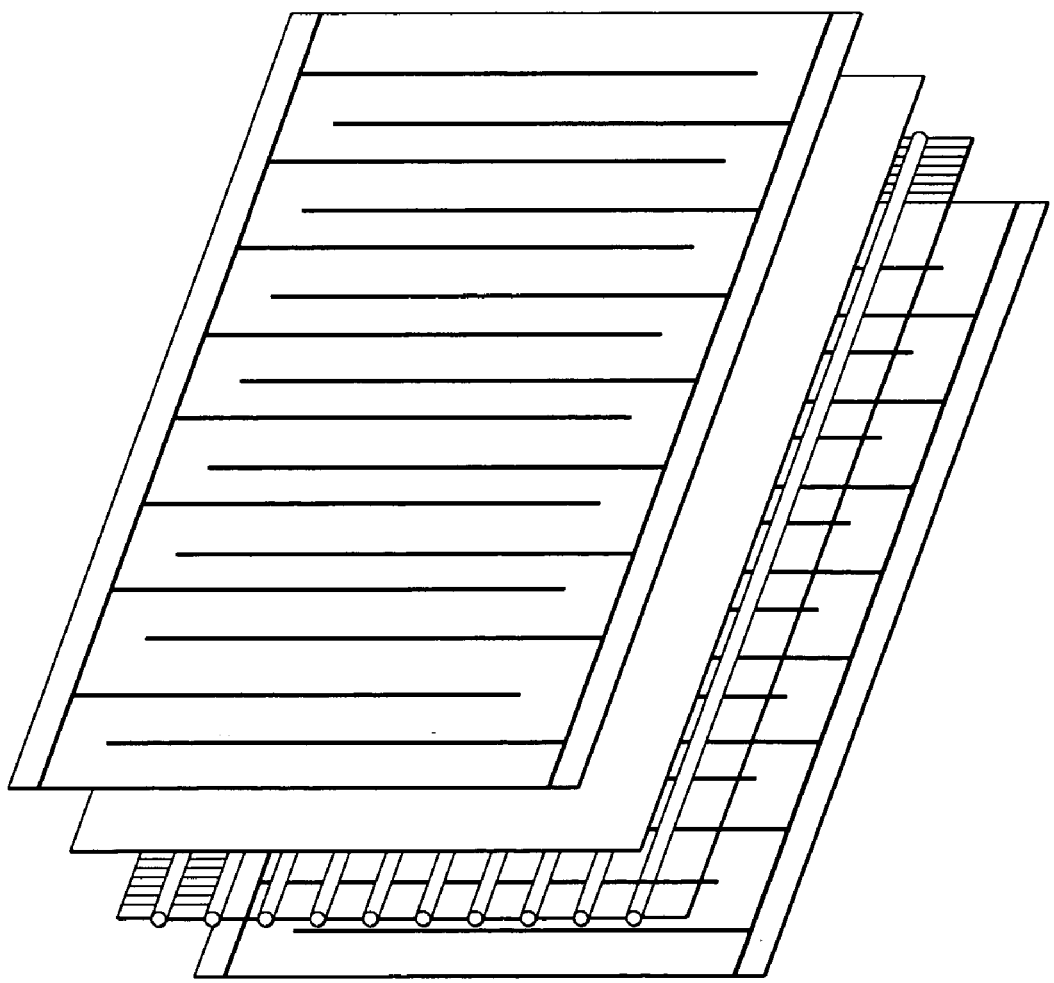
FIG. 4 illustrates an alternate electrode pattern etched on metal clad plastic film and is an exploded view of an actuator fabricated according to an alternate method of this invention.

FIG. 4 shows an alternating electrode pattern etched on a plastic film and illustrates, in an exploded view, an actuator assembly with the etched electrode film on both sides of the fibers/rods 12. After the assembled actuator is cured, a suitable DC electric field is applied to the sandwiched assembly so that the fibers/rods 12 are polarized in the direction of the fiber diameter or thickness.

Having thus described my invention with the detail and particularity required by the Patent Laws, what is desired protected by Letters Patent is set forth in the following claims.

The invention claimed is:

1. Method of making a gas matrix composite ultrasound transducer comprising the steps of:
    a) forming a first structure by aligning piezoelectric rods or fibers substantially parallel to each other on an adhesive side of a first curable adhesive-faced sheet;
    b) placing a second sheet with adhesive on both sides over the first structure so as to provide a gap between the rods or fibers;
    c) aligning piezoelectric rods or fibers on the second sheet substantially parallel to the rod or fibers of the first structure;
    d) repeating steps b) and c) a plurality of times to build a second structure so as to maintain the air gaps between the rods or fibers;
    e) curing the adhesive in the second structure;
    f) cutting the cured second structure perpendicular to the rods or fibers into narrow slices to form third structures; and
    g) applying a conductive layer to each face of a third structure to form electrical contacts with both ends of the rods or fibers.

2. The method according to claim 1, wherein the first and second sheets have substrates of compressed fibers.

3. The method according to claim 1, wherein the first and second sheets have substrates of paper or cardboard.

4. The method according to claim 1, wherein the first and second sheets have substrates of meta-aramid fiber paper.

5. The method according to claim 1, wherein the gap formed between the rods or fibers is an air gap.

* * * * *